United States Patent
Imamura (10) Patent No.: US 10,944,375 B2
(45) Date of Patent: Mar. 9, 2021

(54) MULTILAYER BAND PASS FILTER

(71) Applicant: Murata Manufacturing Co., Ltd., Nagaokakyo-shi, Kyoto-fu (JP)

(72) Inventor: Mitsutoshi Imamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/194,441

(22) Filed: Nov. 19, 2018

(65) Prior Publication Data
US 2019/0181826 A1 Jun. 13, 2019

(30) Foreign Application Priority Data
Dec. 8, 2017 (JP) .............................. JP2017-236077

(51) Int. Cl.
*H03H 7/01* (2006.01)
*H03H 7/09* (2006.01)
*H03H 1/00* (2006.01)

(52) U.S. Cl.
CPC ........ *H03H 7/1775* (2013.01); *H03H 7/0115* (2013.01); *H03H 7/09* (2013.01); *H03H 7/1708* (2013.01); *H03H 7/1725* (2013.01); *H03H 2001/0085* (2013.01)

(58) Field of Classification Search
CPC ......... H03H 2001/0085; H03H 7/0115; H03H 7/09; H03H 7/1725; H03H 7/1775; H03H 7/1708
USPC ................................................ 333/175, 185
See application file for complete search history.

(56) References Cited

U.S. PATENT DOCUMENTS

| 5,132,647 | A | 7/1992 | Lopez et al. |
| 2007/0241839 | A1* | 10/2007 | Taniguchi ............... H03H 7/09 333/185 |
| 2012/0313730 | A1 | 12/2012 | Ootsuka |
| 2013/0229241 | A1* | 9/2013 | Imamura ............. H01P 1/20345 333/185 |
| 2017/0093358 | A1 | 3/2017 | Imamura |

FOREIGN PATENT DOCUMENTS

| EP | 2 009 787 A1 | 12/2008 |
| JP | 48-011944 A | 2/1973 |
| JP | 2003-258587 A | 9/2003 |
| JP | 2012-060440 A | 3/2012 |

(Continued)

OTHER PUBLICATIONS

Official Communication issued in Taiwanese Patent Application No. 107142715, dated May 27, 2019.

(Continued)

*Primary Examiner* — Rakesh B Patel
(74) *Attorney, Agent, or Firm* — Keating & Bennett, LLP (57) ABSTRACT

A multilayer band pass filter includes a first LC parallel resonator electrically connected to a first input/output terminal, a second LC parallel resonator electrically connected to a second input/output terminal, and a third LC parallel resonator is magnetically coupled to the first LC parallel resonator. The first LC parallel resonator includes a first inductor. The second LC parallel resonator includes a second inductor. The third LC parallel resonator is magnetically coupled to the second LC parallel resonator. A bypass connects the first inductor and the second inductor to each other.

14 Claims, 7 Drawing Sheets

(56) References Cited

FOREIGN PATENT DOCUMENTS

| | | |
|---|---|---|
| JP | 2017-063394 A | 3/2017 |
| TW | 201330494 A | 7/2013 |
| WO | 2007/119356 A1 | 10/2007 |

OTHER PUBLICATIONS

Official Communication issued in Japanese Patent Application No. 2017-236077, dated Mar. 10, 2020.
Official Communication issued in Japanese Patent Application No. 2017-236077, dated Jul. 14, 2020.

* cited by examiner

MULTILAYER BAND PASS FILTER

CROSS REFERENCE TO RELATED APPLICATIONS

This application claims the benefit of priority to Japanese Patent Application No. 2017-236077 filed on Dec. 8, 2017. The entire contents of this application are hereby incorporated herein by reference.

BACKGROUND OF THE INVENTION

1. Field of the Invention

The present invention relates to a multilayer band pass filter.

2. Description of the Related Art

Heretofore, multilayer band pass filters have been known. For example, International Publication No. 2007/119356 discloses a multilayer band pass filter in which inter-input-output capacitor electrodes, which are for connecting an input electrode and an output electrode with capacitances, are provided in a prescribed electrode layer among a plurality of electrode layers. An attenuation pole is generated on the high-frequency side of the pass band and two attenuation poles are generated on the low-frequency side of the pass band by the inter-input-output capacitor electrodes. As a result, the attenuation characteristic from the pass band toward the low-frequency side and the attenuation characteristic from the pass band toward the high-frequency side can be made steep.

In order to make the frequency characteristic of a multilayer band pass filter be close to a desired frequency characteristic, it may be necessary to change the frequency of an attenuation pole generated at a higher frequency than the pass band or an attenuation pole generated at a lower frequency than the pass band. However, International Publication No. 2007/119356 does not specifically disclose a configuration that enables the frequency of an attenuation pole generated at a higher frequency than the pass band or an attenuation pole generated at a lower frequency than the pass band to be changed.

SUMMARY OF THE INVENTION

Preferred embodiments of the present invention provide multilayer band pass filter that each achieve a frequency characteristic equal or close to a desired frequency characteristic.

A multilayer band pass filter according to a preferred embodiment of the present invention is provided as a multilayer body in which a plurality of dielectric layers are stacked in a stacking direction. The multilayer band pass filter includes first and second terminals, first to third LC parallel resonators, and a bypass. A first LC parallel resonator is electrically connected to the first terminal. The first LC parallel resonator includes a first inductor. The second LC parallel resonator is electrically connected to the second terminal. The second LC parallel resonator includes a second inductor. The third LC parallel resonator is magnetically coupled to the first LC parallel resonator. The third LC parallel resonator is magnetically coupled to the second LC parallel resonator. The bypass connects the first inductor and the second inductor to each other. A first connection point between the first inductor and the bypass is located between one end and another end of the first inductor. A second connection point between the second inductor and the bypass is located between one end and another end of the second inductor.

With the multilayer band pass filter according to this preferred embodiment of the present invention, the frequency of an attenuation pole generated at a higher frequency than the pass band or the frequency of an attenuation pole generated at a lower frequency than the pass band is able to be changed by the bypass that connects the first inductor and the second inductor to each other. As a result, the frequency characteristic of the multilayer band pass filter is able to be made close to a desired frequency characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail while referring to the drawings. In the figures, generally, identical or corresponding portions are denoted by the same symbols and repeated description thereof is omitted.

First Preferred Embodiment

Figure 1:
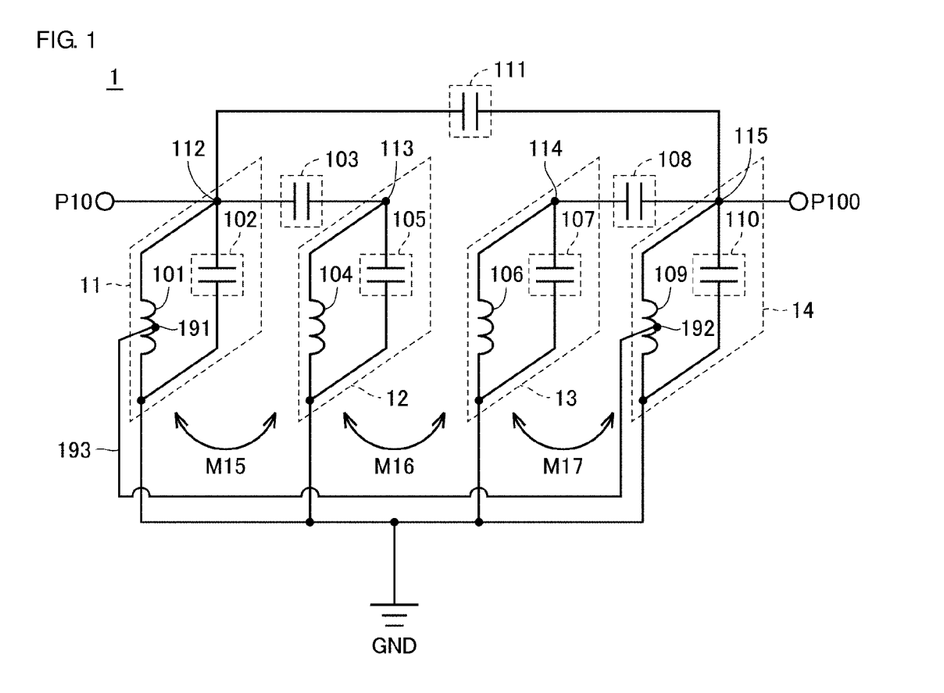
FIG. 1 is an equivalent circuit diagram of a multilayer band pass filter according to a first preferred embodiment of the present invention.

FIG. 1 is an equivalent circuit diagram of a multilayer band pass filter 1 according to a first preferred embodiment.

As illustrated in FIG. 1, the multilayer band pass filter 1 preferably includes input/output terminals P10 and P100, LC parallel resonators 11 to 14, capacitors 103, 108, 111, and a bypass 193.

The capacitor 103 is connected between the LC parallel resonators 11 and 12. The LC parallel resonator 11 is connected to the capacitor 103 at a connection point 112. The LC parallel resonator 11 is connected between the connection point 112 and a ground point GND. The LC parallel resonator 12 is connected to the capacitor 103 at a connection point 113. The LC parallel resonator 12 is connected between the connection point 113 and the ground point GND.

The capacitor 108 is connected between the LC parallel resonators 13 and 14. The LC parallel resonator 13 is connected to the capacitor 108 at a connection point 114. The LC parallel resonator 13 is connected between the connection point 114 and the ground point GND. The LC parallel resonator 14 is connected to the capacitor 108 at a connection point 115. The LC parallel resonator 14 is connected between the connection point 115 and the ground point GND.

The capacitor 111 is connected between the connection points 112 and 115. The LC parallel resonator 11 includes an inductor 101 and a capacitor 102. The LC parallel resonator 12 includes an inductor 104 and a capacitor 105. The LC parallel resonator 13 includes an inductor 106 and a capacitor 107. The LC parallel resonator 14 includes an inductor 109 and a capacitor 110. Preferably, no capacitor is connected between the LC parallel resonator 12 and the LC parallel resonator 13.

Magnetic coupling M15 is generated between the inductors 101 and 104. Magnetic coupling M16 is generated between the inductors 104 and 106. Magnetic coupling M17 is generated between the inductors 106 and 109.

The bypass 193 connects the inductors 101 and 109 to each other. A first connection point 191 between the inductor 101 and the bypass 193 is located between one end and the other end of the inductor 101. A second connection point 192 between the inductor 109 and the bypass 193 is located between one end and the other end of the inductor 109.

The LC parallel resonator 11 is electrically connected to the input/output terminal P10 and a signal is transmitted between the LC parallel resonator 11 and the input/output terminal P10 without the use of magnetic coupling. The LC parallel resonator 14 is electrically connected to the input/output terminal P100 and a signal is transmitted between the LC parallel resonator 14 and the input/output terminal P100 without the use of magnetic coupling.

When a signal is input to the input/output terminal P10, the signal is transmitted to the LC parallel resonator 11 without the use of any magnetic coupling. The signal transmitted to the LC parallel resonator 11 is transmitted to the LC parallel resonator 12 via the magnetic coupling M15, transmitted to the LC parallel resonator 13 via the magnetic coupling M16, and transmitted to the LC parallel resonator 14 via the magnetic coupling M17. The signal transmitted to the LC parallel resonator 14 is transmitted to the input/output terminal P100 without the use of magnetic coupling and is then output from the input/output terminal P100.

When a signal is input to the input/output terminal P100, the signal is transmitted to the LC parallel resonator 14 without the use of magnetic coupling. The signal transmitted to the LC parallel resonator 14 is transmitted to the LC parallel resonator 13 via the magnetic coupling M17, is transmitted to the LC parallel resonator 12 via the magnetic coupling M16, and is transmitted to the LC parallel resonator 11 via the magnetic coupling M15. The signal transmitted to the LC parallel resonator 11 is transmitted to the input/output terminal P10 without the use of magnetic coupling and is then output from the input/output terminal P10.

Hereafter, an LC parallel resonator that is electrically connected to an input terminal to which a signal is input and to which a signal is transmitted from the input terminal without the use of magnetic coupling (input-side LC parallel resonator) and an LC parallel resonator that is electrically connected to an output terminal from which the signal from the input terminal is output and from which the signal is transmitted to the output terminal without the use of magnetic coupling (output-side LC parallel resonator) as in the case of the LC parallel resonators 11 and 14 will be referred to as "both end LC parallel resonators". In addition, LC parallel resonators to which signals from the both end LC parallel resonators are transmitted via magnetic coupling as in the case of the LC parallel resonators 12 and 13 will be referred to as LC parallel resonators arranged between the both end LC parallel resonators.

The impedance of a signal path that extends from the input terminal to an input-side LC parallel resonator is smaller than the impedance of each signal path that extends from the input terminal to an LC parallel resonator arranged between the both end LC parallel resonators and is smaller than the impedance of a signal line that extends from the input terminal to the output-side LC parallel resonator.

In the multilayer band pass filter 1, the impedance of the signal path that extends from the input/output terminal P10 to the LC parallel resonator 11 is smaller than the impedances of the signal paths that extend from the input/output terminal P10 to the LC parallel resonators 12 to 14. The impedance of the signal path that extends from the input/output terminal P100 to the LC parallel resonator 14 is smaller than the impedances of the signal paths that extend from the input/output terminal P100 to the LC parallel resonators 13 to 11.

The meaning of the expression "two circuit elements are electrically connected to each other" includes both the case where two circuit elements are directly connected to each other and the case where two circuit elements are indirectly electrically connected to each other via another circuit element (for example, a capacitor).

Figure 2:
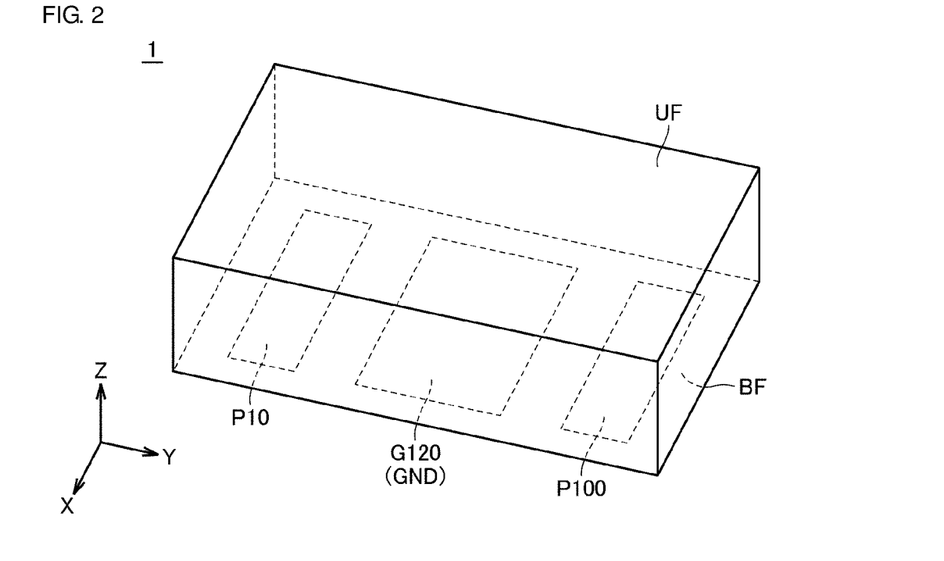
FIG. 2 is an external perspective view of the multilayer band pass filter in FIG. 1.

FIG. 2 is an external perspective view of the multilayer band pass filter 1 in FIG. 1. Regarding the coordinate axes, an X axis and a Y axis are orthogonal to each other, and a Z axis (stacking direction) is orthogonal to the X axis and the Y axis. The same is also true for the coordinate axes illustrated in FIGS. 3 and 9.

As illustrated in FIG. 2, the multilayer band pass filter 1 preferably has a rectangular parallelepiped or substantially rectangular parallelepiped shape, for example. The surfaces of the outermost layers of the multilayer band pass filter 1 that are perpendicular to the stacking direction are a top surface UF and a bottom surface BF.

The input/output terminals P10 and P100 and a ground terminal G120 are provided on the bottom surface BF. The ground terminal G120 defines the ground point GND. The input/output terminals P10 and P100 and the ground terminal G120 are preferably provided as land grid array (LGA) terminals, which are planar electrodes regularly arranged on the bottom surface BF, for example. The bottom surface BF is connected to a substrate, which is not illustrated.

Figure 3:
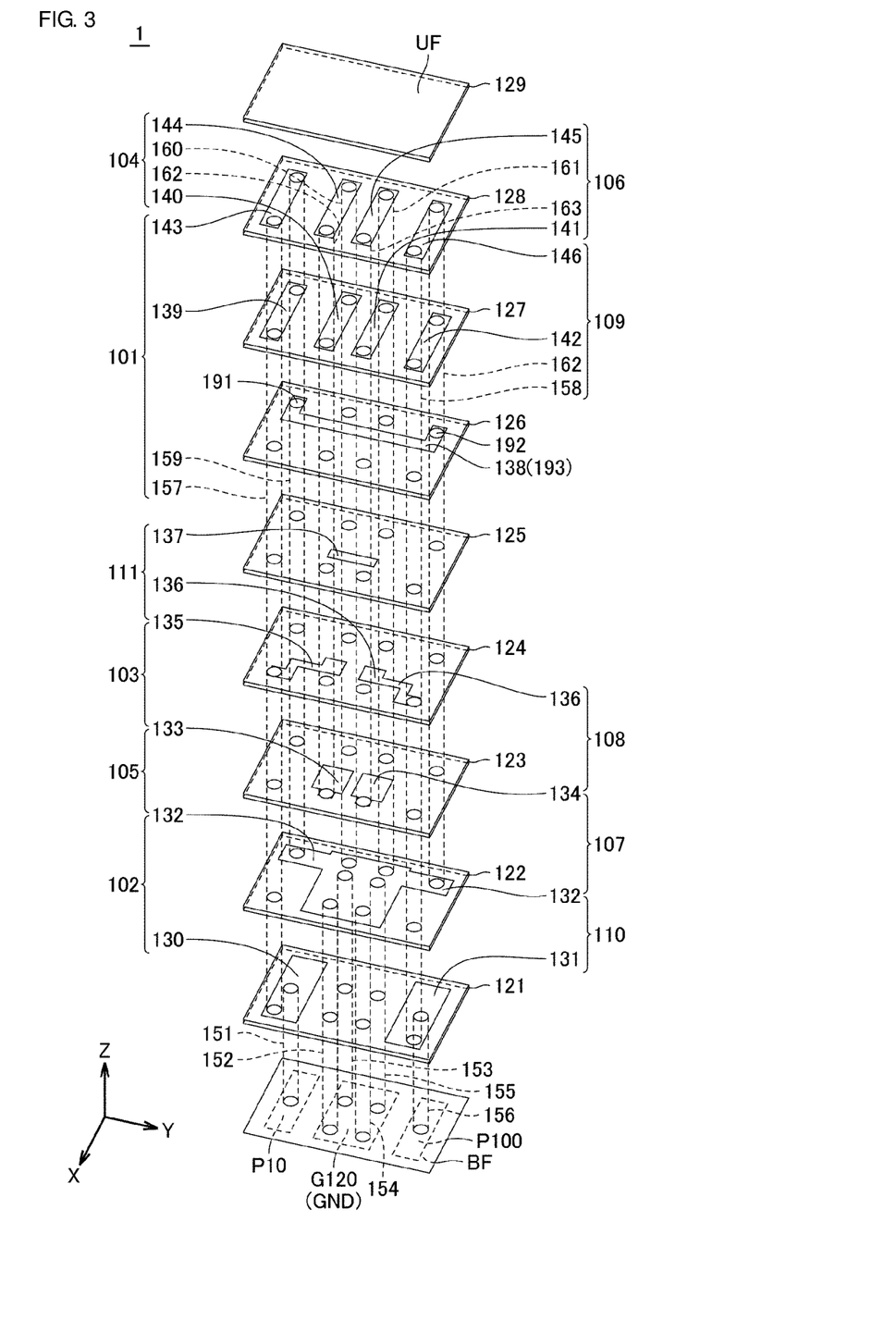
FIG. 3 is an exploded perspective view illustrating an example of the multilayer structure of the multilayer band pass filter in FIG. 2.

FIG. 3 is an exploded perspective view illustrating an example of the multilayer structure of the multilayer band pass filter 1 in FIG. 2. As illustrated in FIG. 3, the multilayer band pass filter 1 is preferably a multilayer body in which a plurality of dielectric layers 121 to 129 are stacked on top of one another in the Z axis direction.

As illustrated in FIG. 3, capacitor conductor patterns 130 and 131 are provided on the dielectric layer 121. The capacitor conductor pattern 130 is connected to the input/output terminal P10 through a via conductor pattern 151. The capacitor conductor pattern 131 is connected to the input/output terminal P100 through a via conductor pattern 156.

A ground conductor pattern 132 is provided on the dielectric layer 122. The ground conductor pattern 132 is connected to the ground terminal G120 through via conductor patterns 152 to 155. The capacitor conductor pattern 130 and the ground conductor pattern 132 define the capacitor 102. The capacitor conductor pattern 131 and the ground conductor pattern 132 define the capacitor 110.

Capacitor conductor patterns 133 and 134 are provided on the dielectric layer 123. The ground conductor pattern 132 and the capacitor conductor pattern 133 define the capacitor 105. The ground conductor pattern 132 and the capacitor conductor pattern 134 define the capacitor 107.

Capacitor conductor patterns 135 and 136 are provided on the dielectric layer 124. The capacitor conductor pattern 135 is connected to the capacitor conductor pattern 130 through a via conductor pattern 157. The capacitor conductor patterns 133 and 135 define the capacitor 103. The capacitor conductor pattern 136 is connected to the capacitor conductor pattern 131 through a via conductor pattern 158. The capacitor conductor patterns 134 and 136 define the capacitor 108.

A capacitor conductor pattern 137 is provided on the dielectric layer 125. The capacitor conductor patterns 135 to 137 define the capacitor 111.

A bypass conductor pattern 138 is provided on the dielectric layer 126. The bypass conductor pattern 138 defines the bypass 193. The bypass conductor pattern 138 is connected to the ground conductor pattern 132 through via conductor patterns 159 and 162. A connection portion between the bypass conductor pattern 138 and the via conductor pattern 159 includes the connection point 191. A connection portion between the bypass conductor pattern 138 and the via conductor pattern 162 includes the connection point 192. The bypass 193 may be defined across a plurality of dielectric layers depending on the internal structure of the multilayer band pass filter. In other words, the bypass 193 may include a via conductor pattern.

Line conductor patterns 139 to 142 are provided on the dielectric layer 127. The line conductor pattern 139 is connected to the capacitor conductor pattern 135 through the via conductor pattern 157. The line conductor pattern 139 is connected to the bypass conductor pattern 138 through the via conductor pattern 159.

The line conductor pattern 140 is connected to the ground conductor pattern 132 through a via conductor pattern 160. The line conductor pattern 140 is connected to the capacitor conductor pattern 133 through the via conductor pattern 162.

The line conductor pattern 141 is connected to the ground conductor pattern 132 through a via conductor pattern 161. The line conductor pattern 141 is connected to the capacitor conductor pattern 134 through a via conductor pattern 163.

The line conductor pattern 142 is connected to the capacitor conductor pattern 131 through the via conductor pattern 158. The line conductor pattern 142 is connected to the bypass conductor pattern 138 through the via conductor pattern 162.

Line conductor patterns 143 to 146 are provided on the dielectric layer 128. The line conductor pattern 143 is connected to the capacitor conductor pattern 139 through the via conductor patterns 157 and 159. The line conductor pattern 144 is connected to the line conductor pattern 140 through the via conductor patterns 160 and 162. The line conductor pattern 145 is connected to the line conductor pattern 141 through the via conductor patterns 161 and 163. The line conductor pattern 146 is connected to the line conductor pattern 142 through the via conductor patterns 158 and 162.

The via conductor pattern 157, the line conductor patterns 139 and 143, and the via conductor pattern 159 define the inductor 101. The via conductor pattern 162, the line conductor patterns 140 and 144, and the via conductor pattern 160 define the inductor 104. The via conductor pattern 163, the line conductor patterns 141 and 145, and the via conductor pattern 161 define the inductor 106. The via conductor pattern 158, the line conductor patterns 142 and 146, and the via conductor pattern 162 define the inductor 109.

Figure 4:
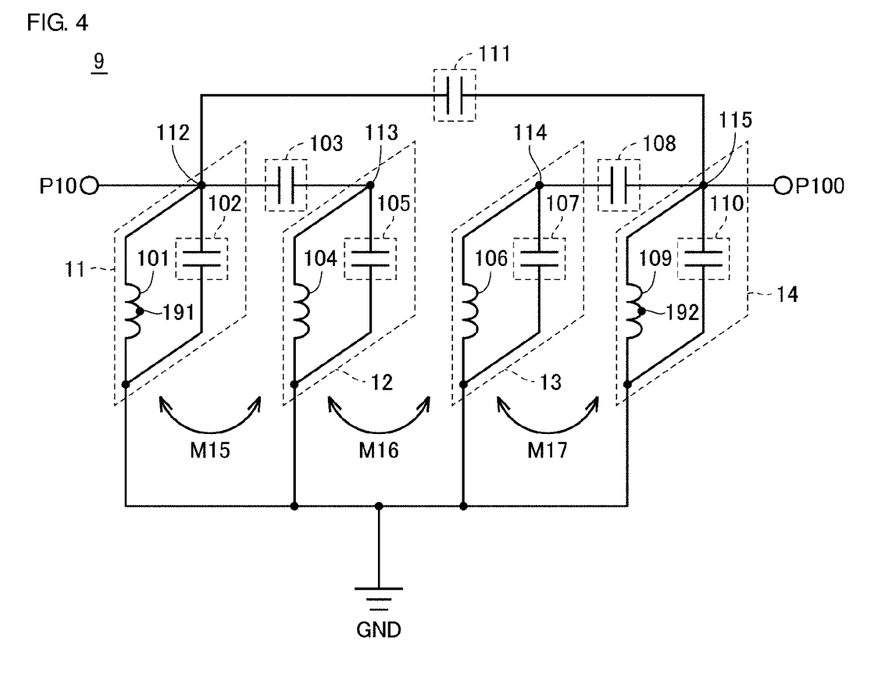
FIG. 4 is an equivalent circuit diagram of a multilayer band pass filter according to a comparative example of the first preferred embodiment of the present invention.

FIG. 4 is an equivalent circuit diagram of a multilayer band pass filter 9 according to a comparative example of the first preferred embodiment. The equivalent circuit diagram of the multilayer band pass filter 9 is obtained by removing the bypass 193 from the equivalent circuit diagram of FIG. 1. The rest of the configuration is preferably the same and therefore description thereof will not be repeated.

Figure 5:
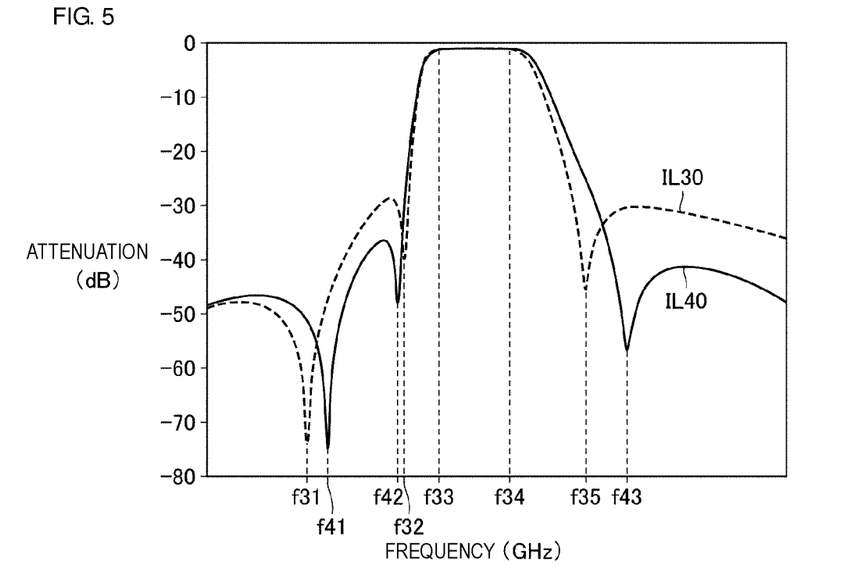
FIG. 5 is a diagram illustrating respective insertion losses in the multilayer band pass filter in FIG. 4 when the capacitance of a capacitor that capacitively couples both end LC parallel resonators is changed between two levels.

FIG. 5 is a diagram illustrating respective insertion losses IL30 and IL40 in the multilayer band pass filter 9 in FIG. 4 when the capacitance of the capacitor 111 that capacitively couples the both end LC parallel resonators 11 and 14 is changed between two levels. The pass band of the multilayer band pass filter 9 is a frequency band extending from f33 to f34 (>f33). The capacitance of the capacitor 111 in the case of the insertion loss IL30 is larger than the capacitance of the capacitor 111 in the case of the insertion loss IL40. Frequencies f31, f32, and f35 at which attenuation poles are generated in the insertion loss IL30 increase in this order. Frequencies f41 to f43 at which attenuation poles are generated in the insertion loss IL40 increase in this order.

Attenuation (dB) on the vertical axis in FIG. 5 has negative values. The insertion loss increases as the absolute value of the attenuation increases. Insertion loss is an index representing the proportion of a signal, out of a signal input to a certain terminal of an electronic component, that is transmitted to the other terminal of the electronic component. This means that the proportion of the signal that is lost inside the electronic component out of the signal input to the electronic component increases as the insertion loss increases. The above description also applies to FIGS. 6, 7, and 11.

As illustrated in FIG. 5, in the insertion loss IL30, attenuation poles are generated at the frequencies f31 and f32 (<f33) in a frequency band that is lower than the pass band. An attenuation pole is generated at the frequency f35 (>f34) in a frequency band that is higher than the pass band. In the insertion loss IL40, attenuation poles are generated at the frequencies f41 (>f31) and f42 (<f32) in a frequency band that is lower than the pass band. An attenuation pole is generated at the frequency f43 (>f35) in a frequency band that is higher than the pass band.

Regarding the frequencies of the attenuation poles, the frequencies f31, f32, and f35 in the insertion loss IL30 respectively change to the frequencies f41, f42, and f43 in the insertion loss IL40. In other words, when the capacitance of the capacitor 111 is changed in the multilayer band pass filter 9, the frequency of an attenuation pole generated in a frequency band that is lower than the pass band and the frequency of an attenuation pole generated in a frequency band that is higher than the pass band both change.

However, in order to make the frequency characteristic of a multilayer band pass filter close to a desired frequency characteristic, it has been discovered that changing the frequency of an attenuation pole generated at a higher frequency than the pass band or an attenuation pole generated at a lower frequency than the pass band may be preferable or advantageous.

Accordingly, in the multilayer band pass filter 1 in FIG. 1, the inductors 101 and 109 respectively included in the both end LC parallel resonators 11 and 14 are connected to each other through the bypass 193. According to the multilayer band pass filter 1, the frequencies f31 and f32 of the attenuation poles generated in a frequency band that is lower than the pass band are able to be changed without substantially changing the frequency f35 of the attenuation pole generated in a frequency band that is higher than the pass band. As a result, the frequency characteristic of the multilayer band pass filter 1 is able to be made close to a desired frequency characteristic.

Figure 6:
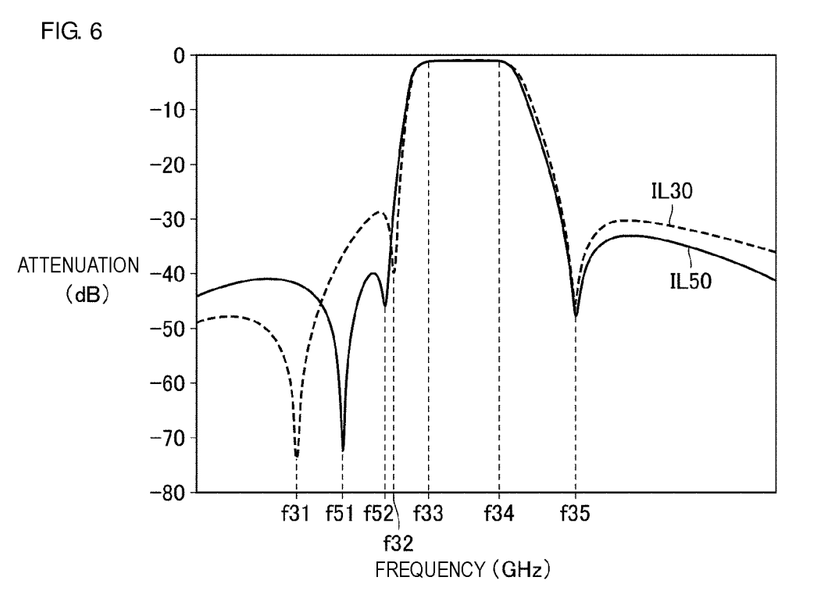
FIG. 6 is a diagram illustrating the insertion loss of the multilayer band pass filter in FIG. 1 and an insertion loss illustrated in FIG. 5.

FIG. 6 is a diagram illustrating an insertion loss IL50 of the multilayer band pass filter 1 in FIG. 1 and the insertion loss IL30 illustrated in FIG. 5. As illustrated in FIG. 6, in the insertion loss IL50, attenuation poles are generated at frequencies f51 (>f31) and f52 (<f32) in a frequency band that is lower than the pass band. In a frequency band that is higher than the pass band, an attenuation pole is generated close to the frequency f35 similarly to as in the insertion loss IL30.

Figure 7:
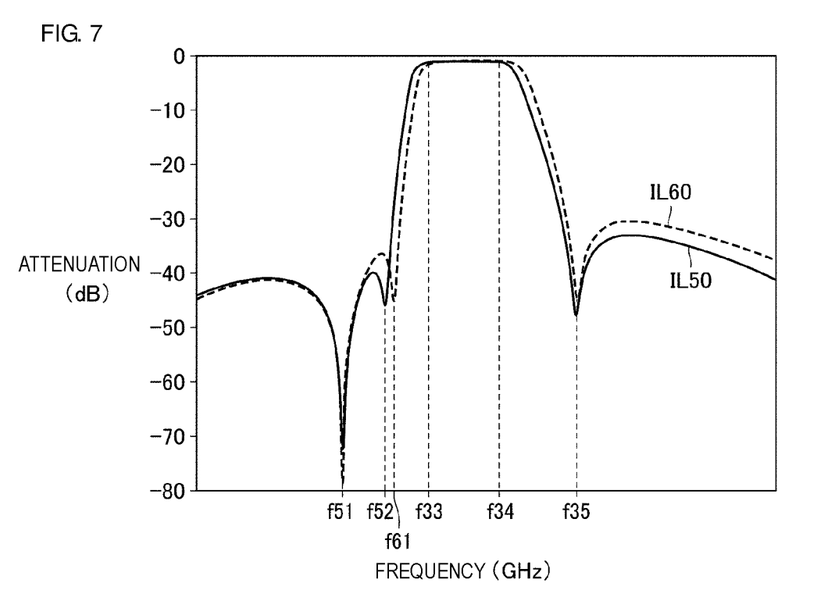
FIG. 7 is a diagram illustrating the respective insertion losses in the multilayer band pass filter in FIG. 1 when the capacitance of a capacitor that capacitively couples both end LC parallel resonators is changed between two levels.

FIG. 7 is a diagram illustrating respective insertion losses IL50 and IL60 in the multilayer band pass filter 1 in FIG. 1 when the capacitance of the capacitor 111 that capacitively couples the both end LC parallel resonators 11 and 14 is changed between two levels. The insertion loss IL50 is the same as the insertion loss IL50 in FIG. 6.

As illustrated in FIG. 7, in the insertion loss IL60, an attenuation pole is generated close to frequency f51 similarly to as the insertion loss IL50 and an attenuation pole is generated at a frequency f61 (>f52) in a frequency band that is lower than the pass band. In a frequency band that is higher than the pass band, an attenuation pole is generated close to the frequency f35 similarly to as in the insertion loss IL50. The frequency of an attenuation pole generated in a frequency band that is lower than the pass band is able to be changed by changing the capacitance of the capacitor 111 that capacitively couples the both end LC parallel resonators 11 and 14.

Referring back to FIG. 1, when a signal is input from the input/output terminal P10, the signal is first transmitted to the LC parallel resonator 11 among the plurality of LC parallel resonators 11 to 14. In addition, when a signal is input from the input/output terminal P100, the signal is first transmitted to the LC parallel resonator 14 among the plurality of LC parallel resonators 11 to 14. Therefore, the impedances of the LC parallel resonators 11 and 14 have the strongest effect on the shape of the pass band of the multilayer band pass filter 1.

Referring back to FIG. 3, the bypass conductor pattern 138 connects the via conductor patterns 159 and 162, which are connected to the ground conductor pattern 132, to each other. It is sufficient that the bypass conductor pattern 138 connect the inductors 101 and 109 to each other, and for example, the bypass conductor pattern 138 may connect the line conductor patterns 139 and 142 to each other, may connect the line conductor patterns 143 and 146 to each other, or may connect the via conductor patterns 157 and 158 to each other.

The portion of the inductor 101 from the connection point 191 with the bypass conductor pattern 138 up to the ground conductor pattern 132 substantially does not function as the inductor of the LC parallel resonator 11. Similarly, the portion of the inductor 109 from the connection point 192 with the bypass conductor pattern 138 up to the ground conductor pattern 132 substantially does not function as the inductor of the LC parallel resonator 14. If the inductances of the LC parallel resonators 11 and 14 are small, the impedances of the LC parallel resonators 11 and 14 may change and the pass band of the multilayer band pass filter 1 may diverge from the desired pass band.

Accordingly, in the multilayer band pass filter 1, the via conductor patterns 159 and 162, which are connected to the ground conductor pattern 132, are connected to each other via the bypass conductor pattern 138 in order to prevent the situation in which the pass band of the multilayer band pass filter 1 diverges from the desired pass band.

In the inductor 101, the via conductor pattern 157, the line conductor pattern 143 (139), and the portion of the via conductor pattern 159 from the line conductor pattern 143 up to the connection point 191 function as the inductor of the LC parallel resonator 11. In the inductor 109, the via conductor pattern 158, the line conductor pattern 146 (142), and the portion of the via conductor pattern 162 preferably define the line conductor pattern 146 up to the connection point 192 function as the inductor of the LC parallel resonator 14.

The via conductor patterns 159 and 162, which are connected to the ground conductor pattern 132, are connected to each other by the bypass conductor pattern 138, and as a result, the signal path of the portion of the inductor 101 that defines and functions as the inductor of the LC parallel resonator 11 and the signal path of the portion of the inductor 109 that defines and functions as the inductor of the LC parallel resonator 14 are able to be made longer than in the case where the line conductor patterns 139 and 142, the line conductor patterns 143 and 146, or the via conductor patterns 157 and 158 are connected to each other by the bypass conductor pattern 138.

According to the multilayer band pass filter 1, a decrease in the inductances of the LC parallel resonators 11 and 14 caused by the inductors 101 and 109 being connected to each other by the bypass conductor pattern 138 is able to be reduced or prevented. That is, according to the multilayer band pass filter 1, an attenuation pole in a frequency band that is higher than the pass band or an attenuation pole in a frequency band that is lower than the pass band is able to be controlled without adversely affecting attenuation of the pass band. As a result, a situation in which the pass band of the multilayer band pass filter 1 diverges from the desired pass band is able to be prevented.

With the multilayer band pass filter according to the first preferred embodiment described above, the frequency characteristic of the multilayer band pass filter is able to be made close to a desired frequency characteristic.

With a multilayer band pass filter according to a preferred embodiment of the present invention, in the case where there are an even number of LC parallel resonators arranged between the both end LC parallel resonators, the frequency of an attenuation pole generated in a frequency band that is lower than the pass band is able to be changed. On the other hand, in the case where there are an odd number of LC parallel resonators arranged between the both end LC parallel resonators, the frequency of an attenuation pole generated in a frequency band that is higher than the pass band is able to be changed.

In the first preferred embodiment, a case is described in which the multilayer band pass filter includes four LC parallel resonators as an example of a case in which there are an even number of LC parallel resonators arranged between the both end LC parallel resonators.

Second Preferred Embodiment

In a second preferred embodiment of the present invention, a case will be described in which the multilayer band pass filter includes three LC parallel resonators as an example of a case in which there are an odd number of LC parallel resonators arranged between the both end LC parallel resonators.

Figure 8:
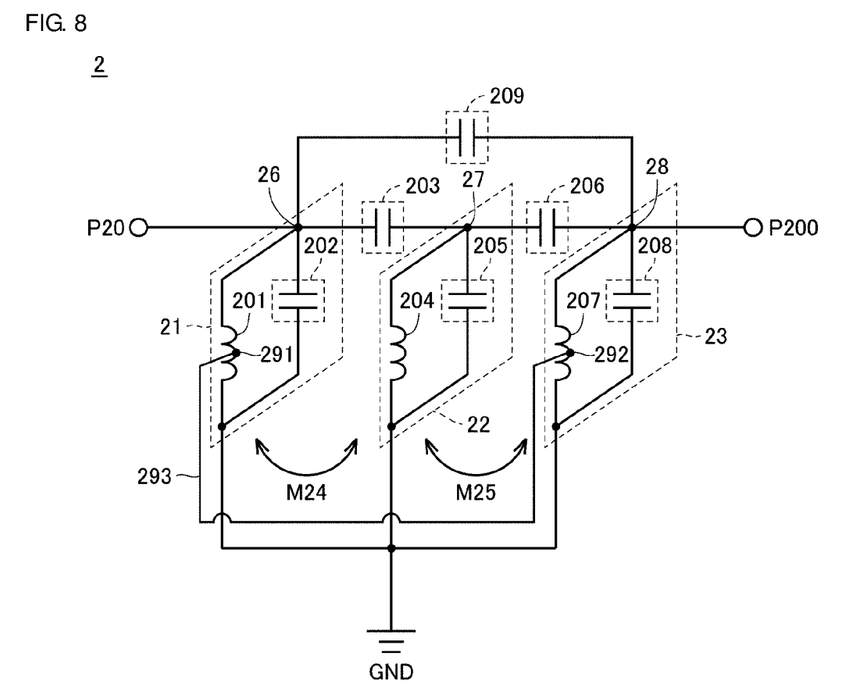
FIG. 8 is an equivalent circuit diagram of a multilayer band pass filter according to a second preferred embodiment of the present invention.

FIG. 8 is an equivalent circuit diagram of a multilayer band pass filter 2 according to the second preferred embodiment. As illustrated in FIG. 8, the multilayer band pass filter 2 preferably includes input/output terminals P20 and P200, LC parallel resonators 21 to 23, capacitors 203, 206, 209, and a bypass 293.

The capacitor 203 is connected between the LC parallel resonators 21 and 22. The LC parallel resonator 21 is connected to the capacitor 203 at a connection point 26. The LC parallel resonator 21 is connected between the connection point 26 and a ground point GND. The LC parallel resonator 22 is connected to the capacitor 203 at a connection point 27. The LC parallel resonator 22 is connected between the connection point 27 and the ground point GND.

The capacitor 206 is connected between the LC parallel resonators 22 and 23. The LC parallel resonator 22 is connected to the capacitor 206 at the connection point 27. The LC parallel resonator 22 is connected between the connection point 27 and the ground point GND. The LC parallel resonator 23 is connected to the capacitor 206 at the connection point 28. The LC parallel resonator 23 is connected between the connection point 28 and the ground point GND.

The capacitor 209 is connected between the connection points 26 and 28. The LC parallel resonator 21 includes an inductor 201 and a capacitor 202. The LC parallel resonator 22 includes an inductor 204 and a capacitor 205. The LC parallel resonator 23 includes an inductor 207 and a capacitor 208. Magnetic coupling M24 is generated between the inductors 201 and 204. Magnetic coupling M25 is generated between the inductors 204 and 207.

The bypass 293 connects the inductors 201 and 207. A connection point 291 between the inductor 201 and the bypass 293 is located between one end and the other end of the inductor 201. A connection point 292 between the inductor 207 and the bypass 293 is located between one end and the other end of the inductor 207.

The LC parallel resonator 21 is electrically connected to the input/output terminal P20 and a signal from the input/output terminal P20 is transmitted thereto without the use of magnetic coupling. The LC parallel resonator 23 is electrically connected to the input/output terminal P200 and a signal from the input/output terminal P200 is transmitted thereto without the use of magnetic coupling.

When a signal is input to the input/output terminal P20, the signal is transmitted to the LC parallel resonator 21 without the use of magnetic coupling. The signal transmitted to the LC parallel resonator 21 is transmitted to the LC parallel resonator 22 via the magnetic coupling M25 and is transmitted to the LC parallel resonator 23 via magnetic coupling M26. The signal transmitted to the LC parallel resonator 23 is transmitted to the input/output terminal P200 without the use of magnetic coupling and is output from the input/output terminal P200.

When a signal is input to the input/output terminal P200, the signal is transmitted to the LC parallel resonator 23 without the use of magnetic coupling. The signal transmitted to the LC parallel resonator 23 is transmitted to the LC parallel resonator 22 via the magnetic coupling M25 and is transmitted to the LC parallel resonator 21 via the magnetic coupling M24. The signal transmitted to the LC parallel resonator 21 is transmitted to the input/output terminal P20 without the use of magnetic coupling and is output from the input/output terminal P20.

Figure 9:
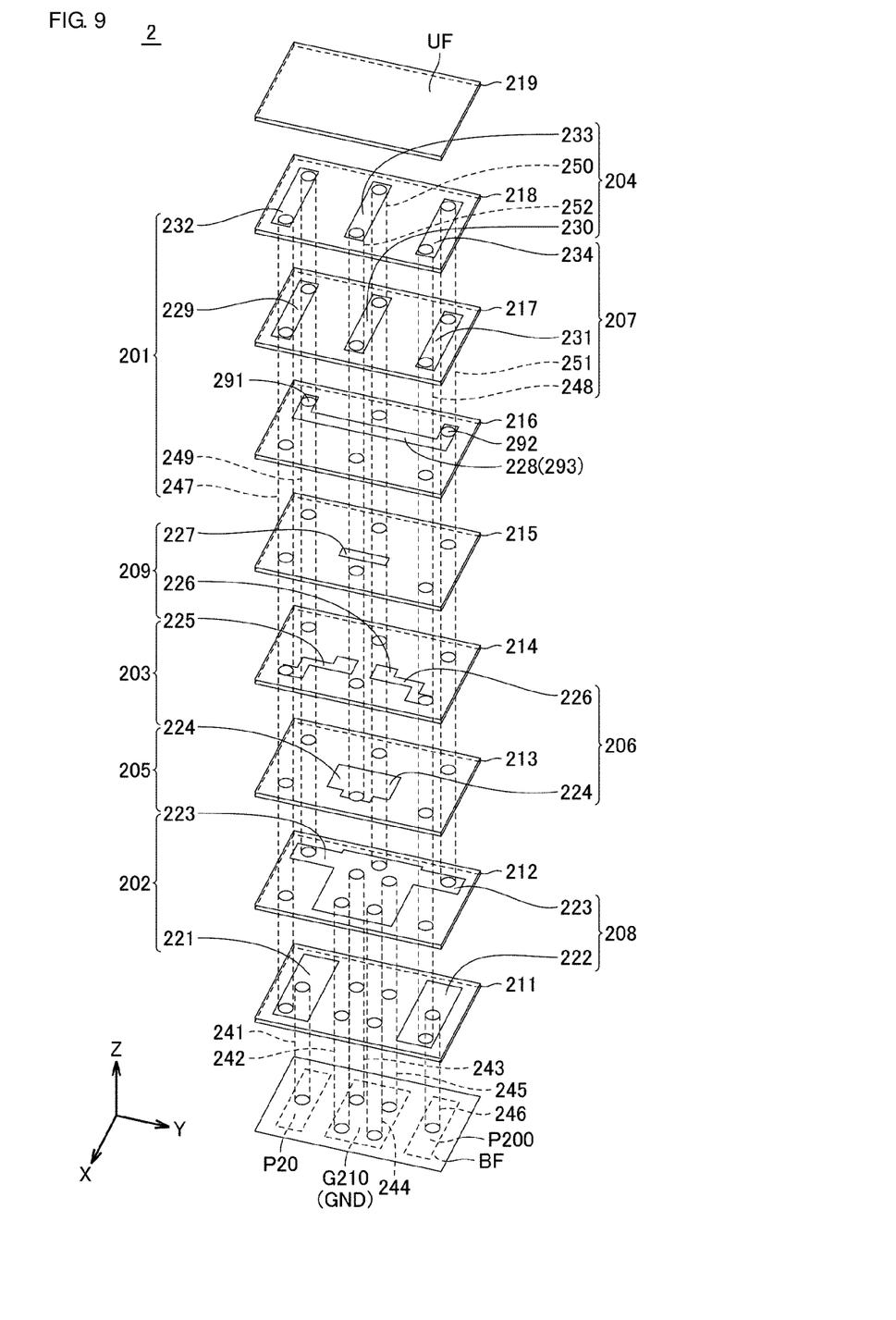
FIG. 9 is an exploded perspective view illustrating an example of the multilayer structure of the multilayer band pass filter in FIG. 8.

FIG. 9 is an exploded perspective view illustrating an example of the multilayer structure of the multilayer band pass filter 2 in FIG. 8. An external perspective view of the multilayer band pass filter 2 is preferably the same as the external perspective view of the multilayer band pass filter 1 illustrated in FIG. 2. As illustrated in FIG. 9, the multilayer band pass filter 2 is preferably a multilayer body in which a plurality of dielectric layers 211 to 219 are stacked on top of one another in the Z axis direction.

The input/output terminals P20 and P200 and a ground terminal G210 are provided on the bottom surface BF. The ground terminal G210 defines ground point GND. The input/output terminals P20 and P200 and the ground terminal G210 are land grid array (LGA) terminals, which are planar electrodes regularly arranged on the bottom surface BF, for example.

Capacitor conductor patterns 221 and 222 are provided on the dielectric layer 211. The capacitor conductor pattern 221 is connected to the input/output terminal P20 through a via conductor pattern 241. The capacitor conductor pattern 222 is connected to the input/output terminal P200 through a via conductor pattern 246.

A ground conductor pattern 223 is provided on the dielectric layer 212. The ground conductor pattern 223 is connected to the ground terminal G210 through via conductor patterns 242 to 245. The capacitor conductor pattern 221 and the ground conductor pattern 223 define the capacitor 202. The capacitor conductor pattern 222 and the ground conductor pattern 223 define the capacitor 208.

A capacitor conductor pattern 224 is provided on the dielectric layer 213. The ground conductor pattern 223 and the capacitor conductor pattern 224 define the capacitor 205.

Capacitor conductor patterns 225 and 226 are provided on the dielectric layer 214. The capacitor conductor pattern 225 is connected to the capacitor conductor pattern 221 through a via conductor pattern 247. The capacitor conductor patterns 224 and 225 define the capacitor 203. The capacitor conductor pattern 226 is connected to the capacitor conductor pattern 222 through a via conductor pattern 248. The capacitor conductor patterns 224 and 226 define the capacitor 206.

A capacitor conductor pattern 227 is provided on the dielectric layer 215. The capacitor conductor patterns 225 to 227 define the capacitor 209.

A bypass conductor pattern 228 is provided on the dielectric layer 216. The bypass conductor pattern 228 defines the bypass 293. The bypass conductor pattern 228 is connected to the ground conductor pattern 223 through via conductor patterns 249 and 251. A connection portion between the bypass conductor pattern 228 and the via conductor pattern 249 includes the connection point 291. A connection portion between the bypass conductor pattern 228 and the via conductor pattern 251 includes the connection point 292.

Line conductor patterns 229 to 231 are provided on the dielectric layer 217. The line conductor pattern 229 is connected to the capacitor conductor pattern 221 through the via conductor pattern 247. The line conductor pattern 229 is connected to the bypass conductor pattern 228 through the via conductor pattern 249.

The line conductor pattern 230 is connected to the capacitor conductor pattern 224 through a via conductor pattern 252. The line conductor pattern 230 is connected to the ground conductor pattern 223 through a via conductor pattern 250.

The line conductor pattern 231 is connected to the capacitor conductor pattern 222 through the via conductor pattern 248. The line conductor pattern 231 is connected to the bypass conductor pattern 228 through the via conductor pattern 251.

Line conductor patterns 232 to 234 are provided on the dielectric layer 218. The line conductor pattern 232 is connected to the line conductor pattern 229 through the via conductor patterns 247 and 249. The line conductor pattern 233 is connected to the line conductor pattern 230 through the via conductor patterns 250 and 252. The line conductor pattern 234 is connected to the line conductor pattern 231 through the via conductor patterns 248 and 251.

The via conductor pattern 247, the line conductor patterns 229 and 232, and the via conductor pattern 249 define the inductor 201. The via conductor pattern 252, the line conductor patterns 230 and 233, and the via conductor pattern 250 define the inductor 204. The via conductor pattern 248, the line conductor patterns 231 and 234, and the via conductor pattern 251 define the inductor 207.

Figure 10:
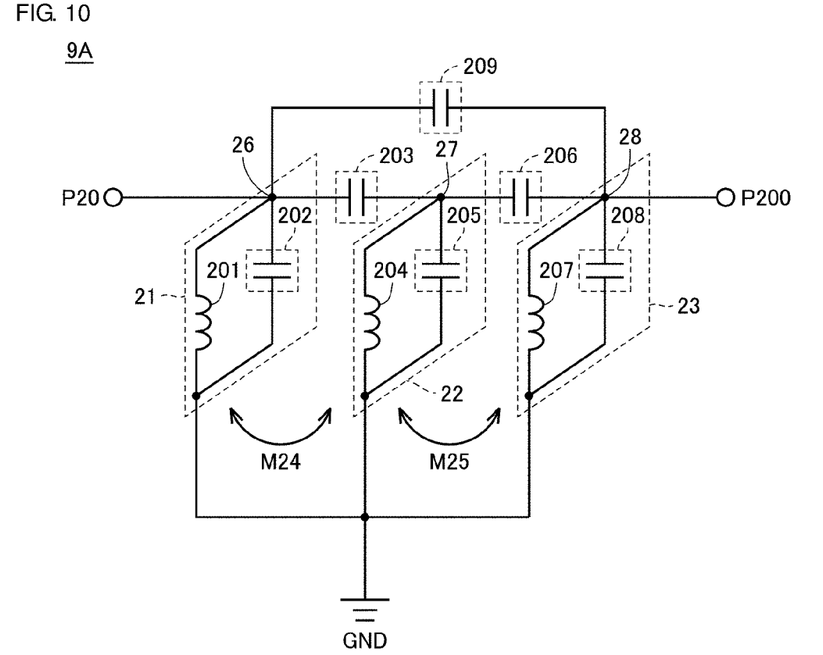
FIG. 10 is an equivalent circuit diagram of a multilayer band pass filter according to a comparative example of the second preferred embodiment of the present invention.

FIG. 10 is an equivalent circuit diagram of a multilayer band pass filter 9A according to a comparative example of second preferred embodiment. The equivalent circuit diagram of the multilayer band pass filter 9A is obtained by removing the bypass 293 from the equivalent circuit diagram of FIG. 8. The rest of the configuration is the same and therefore description thereof will not be repeated.

Figure 11:
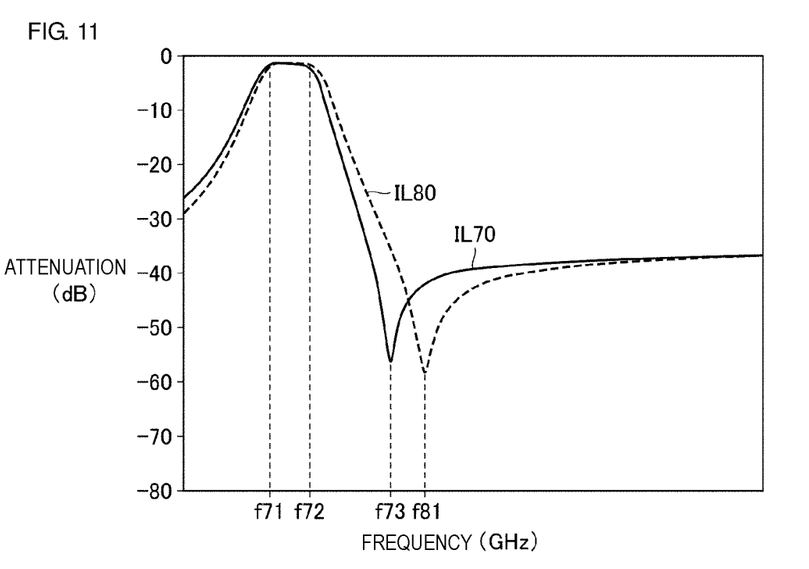
FIG. 11 is a diagram illustrating the insertion loss of the multilayer band pass filter in FIG. 8 and the insertion loss of the multilayer band pass filter in FIG. 10.

FIG. 11 is a diagram illustrating insertion loss IL70 of the multilayer band pass filter 2 in FIG. 8 and insertion loss IL80 of the multilayer band pass filter 9A in FIG. 10. The pass band of the multilayer band pass filters 2 and 9A is a frequency band extending from f71 to f72 (>f71).

As illustrated in FIG. 11, an attenuation pole is generated in a frequency band that is higher than the pass band in both the insertion loss IL70 and the insertion loss IL80. An attenuation pole is generated at the frequency f73 (>f72) in the insertion loss IL70. On the other hand, an attenuation pole is generated at the frequency f81 (>f73) in the insertion loss IL80. According to the multilayer band pass filter 2, the inductors 201 and 207 respectively included in the both end LC parallel resonators 21 and 23 are connected to each other by the bypass 293, and as a result the frequency of an attenuation pole generated in a frequency band that is higher than the pass band is able to be changed.

With the multilayer band pass filter according to second preferred embodiment described above, the frequency characteristic of the multilayer band pass filter is able to be made close to a desired frequency characteristic.

Regarding the number of LC parallel resonators arranged between the both end LC parallel resonators, the case in which two LC parallel resonators are arranged has been described in first preferred embodiment and the case in which one LC parallel resonator is arranged has been described in second preferred embodiment. The number of LC parallel resonators arranged between the both end LC parallel resonators may instead be three or more.

Is also intended that the presently disclosed preferred embodiments be combined with each other as appropriate so long as there are no incompatibilities. The presently disclosed preferred embodiments are illustrative in all points and should not be considered as limiting. The scope of the present invention is not defined by the above description but rather by the scope of the claims and it is intended that equivalents to the scope of the claims and all modifications within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator;
a bypass;
first, second, and third capacitors; and
a fourth LC parallel resonator that is magnetically coupled to the second LC parallel resonator and is magnetically coupled to the third LC parallel resonator; wherein
the first LC parallel resonator includes a first inductor;
the second LC parallel resonator includes a second inductor;
the bypass connects the first inductor and the second inductor to each other;
a first connection point between the first inductor and the bypass is located between one end and another end of the first inductor;
a second connection point between the second inductor and the bypass is located between one end and another end of the second inductor;
the first capacitor is connected between the first LC parallel resonator and the third LC parallel resonator;
the second capacitor is connected between the second LC parallel resonator and the fourth LC parallel resonator;
the first LC parallel resonator is connected between a ground point and a third connection point between the first capacitor and the first LC parallel resonator;
the second LC parallel resonator is connected between the ground point and a fourth connection point between the second capacitor and the second LC parallel resonator;
the third LC parallel resonator is connected between the ground point and a fifth connection point between the first capacitor and the third LC parallel resonator;
the fourth LC parallel resonator is connected between the ground point and a sixth connection point between the second capacitor and the fourth LC parallel resonator; and
the third capacitor is connected between the third connection point and the fourth connection point.
2. The multilayer band pass filter according to claim 1, wherein the first terminal and the second terminal are input/output terminals of the multilayer band pass filter.

3. The multilayer band pass filter according to claim 1, wherein an impedance of an input signal path that extends from the first terminal to an input-side one of the first, second, and third LC parallel resonators is smaller than an impedance of each signal path that extends from the first terminal to remaining ones of the first, second, and third LC parallel resonators.

4. The multilayer band pass filter according to claim 1, wherein the multilayer band pass filter has a rectangular parallelepiped or substantially rectangular parallelepiped shape.

5. The multilayer band pass filter according to claim 1, wherein the first terminal, the second terminal, and a ground terminal are provided on a single external surface of the multilayer band pass filter.

6. The multilayer band pass filter according to claim 1, wherein
the plurality of dielectric layers includes a first dielectric layer on which a ground conductor pattern is provided;
the first inductor includes a first via conductor pattern that extends in the stacking direction;
the second inductor includes a second via conductor pattern that extends in the stacking direction;
the first and second via conductor patterns are connected to the ground conductor pattern;
the first connection point is located between one end and another end of the first via conductor pattern; and
the second connection point is located between one end and another end of the second via conductor pattern.

7. The multilayer band pass filter according to claim 6, wherein
the bypass includes a bypass conductor pattern; and
portions of the bypass conductor pattern are provided on multiple ones of the plurality of dielectric layers.

8. The multilayer band pass filter according to claim 6, wherein the bypass includes a bypass conductor pattern, an entirety of the bypass conductor pattern being provided on a single one of the plurality of dielectric layers.

9. The multilayer band pass filter according to claim 1, wherein no capacitor is directly connected between the second LC parallel resonator and the third LC parallel resonator.

10. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator; and
a bypass; wherein
the first LC parallel resonator includes a first inductor;
the second LC parallel resonator includes a second inductor;
the bypass connects the first inductor and the second inductor to each other;
a first connection point between the first inductor and the bypass is located between one end and another end of the first inductor;
a second connection point between the second inductor and the bypass is located between one end and another end of the second inductor;
the plurality of dielectric layers includes a first dielectric layer on which a ground conductor pattern is provided;
the first inductor includes a first via conductor pattern that extends in the stacking direction;
the second inductor includes a second via conductor pattern that extends in the stacking direction;
the first and second via conductor patterns are connected to the ground conductor pattern;
the first connection point is located between one end and another end of the first via conductor pattern;
the second connection point is located between one end and another end of the second via conductor pattern;
the plurality of dielectric layers further includes a second dielectric layer;
the bypass includes a bypass conductor pattern that is provided on the second dielectric layer; and
the bypass conductor pattern connects the first connection point and the second connection point to each other.

11. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator;
a bypass; and
first, second, and third capacitors; wherein
the first LC parallel resonator includes a first inductor;
the second LC parallel resonator includes a second inductor;
the bypass connects the first inductor and the second inductor to each other;
a first connection point between the first inductor and the bypass is located between one end and another end of the first inductor;
a second connection point between the second inductor and the bypass is located between one end and another end of the second inductor;
the first capacitor is connected between the first LC parallel resonator and the third LC parallel resonator;
the second capacitor is connected between the second LC parallel resonator and the third LC parallel resonator;
the first LC parallel resonator is connected between a ground point and a third connection point between the first capacitor and the first LC parallel resonator;
the second LC parallel resonator is connected between the ground point and a fourth connection point between the second capacitor and the second LC parallel resonator;
the first and second capacitors are connected to a fifth connection point;
the third LC parallel resonator is connected between the ground point and the fifth connection point; and
the third capacitor is connected between the third connection point and the fourth connection point.

12. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator; and a bypass; wherein
the first LC parallel resonator includes a first inductor;
the second LC parallel resonator includes a second inductor;
the bypass connects the first inductor and the second inductor to each other;
a first connection point between the first inductor and the bypass is located between one end and another end of the first inductor;
a second connection point between the second inductor and the bypass is located between one end and another end of the second inductor; and
an impedance of an input signal path that extends from the first terminal to an input- side of one of the first, second, and third LC parallel resonators is smaller than an impedance of each signal path that extends from the first terminal to remaining ones of the first, second, and third LC parallel resonators.

13. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator; and
a bypass; wherein
the first LC parallel resonator includes a first inductor;
the second LC parallel resonator includes a second inductor;
the bypass connects the first inductor and the second inductor to each other;
a first connection point between the first inductor and the bypass is located between one end and another end of the first inductor;
a second connection point between the second inductor and the bypass is located between one end and another end of the second inductor;
the plurality of dielectric layers includes a first dielectric layer on which a ground conductor pattern is provided;
the first inductor includes a first via conductor pattern that extends in the stacking direction;
the second inductor includes a second via conductor pattern that extends in the stacking direction;
the first and second via conductor patterns are connected to the ground conductor pattern;
the first connection point is located between one end and another end of the first via conductor pattern;
the second connection point is located between one end and another end of the second via conductor pattern;
the bypass includes a bypass conductor pattern; and
portions of the bypass conductor pattern are provided on multiple ones of the plurality of dielectric layers.

14. A multilayer band pass filter comprising:
a plurality of dielectric layers stacked in a stacking direction;
first and second terminals;
a first LC parallel resonator that is electrically connected to the first terminal;
a second LC parallel resonator that is electrically connected to the second terminal;
a third LC parallel resonator that is magnetically coupled to the first LC parallel resonator and is magnetically coupled to the second LC parallel resonator; and a bypass; wherein the first LC parallel resonator includes a first inductor; the second LC parallel resonator includes a second inductor; the bypass connects the first inductor and the second inductor to each other; a first connection point between the first inductor and the bypass is located between one end and another end of the first inductor;
a second connection point between the second inductor and the bypass is located between one end and another end of the second inductor;
the plurality of dielectric layers includes a first dielectric layer on which a ground conductor pattern is provided;
the first inductor includes a first via conductor pattern that extends in the stacking direction;
the second inductor includes a second via conductor pattern that extends in the stacking direction;
the first and second via conductor patterns are connected to the ground conductor pattern;
the first connection point is located between one end and another end of the first via conductor pattern;
the second connection point is located between one end and another end of the second via conductor pattern; and
the bypass includes a bypass conductor pattern, an entirety of the bypass conductor pattern being provided on a single one of the plurality of dielectric layers.

\* \* \* \* \*